(12) United States Patent
Kim et al.

(10) Patent No.: US 11,010,289 B2
(45) Date of Patent: May 18, 2021

(54) DATA STORAGE DEVICE AND OPERATING METHOD THEREOF

(71) Applicant: SK hynix Inc., Gyeonggi-do (KR)

(72) Inventors: Se Hyun Kim, Gyeonggi-do (KR); Joong Seob Yang, Gyeonggi-do (KR); Eui Jin Kim, Gyeonggi-do (KR); Jong Min Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 87 days.

(21) Appl. No.: 16/289,096

(22) Filed: Feb. 28, 2019

(65) Prior Publication Data

US 2019/0196954 A1    Jun. 27, 2019

Related U.S. Application Data

(63) Continuation of application No. 14/600,909, filed on Jan. 20, 2015, now abandoned.

(30) Foreign Application Priority Data

Oct. 7, 2014 (KR) .................. 10-2014-0134982

(51) Int. Cl.
*G06F 12/02* (2006.01)
*G11C 16/34* (2006.01)

(52) U.S. Cl.
CPC .. *G06F 12/0238* (2013.01); *G06F 2212/1016* (2013.01); *G06F 2212/1032* (2013.01); *G06F 2212/7204* (2013.01); *G06F 2212/7205* (2013.01); *G11C 16/3495* (2013.01)

(58) Field of Classification Search
None
See application file for complete search history.

(56) References Cited

U.S. PATENT DOCUMENTS

| 6,104,638 | A | 8/2000 | Larner et al. |
| 6,446,223 | B1 * | 9/2002 | Morishita ............ G06F 3/0601 |
| | | | 711/162 |
| 2013/0055046 | A1 | 2/2013 | Blodgett |
| 2013/0097403 | A1 | 4/2013 | Zheng et al. |
| 2013/0311837 | A1 | 11/2013 | Bedeschi |
| 2013/0339659 | A1 | 12/2013 | Bybell et al. |
| 2014/0165215 | A1 | 6/2014 | Kurkure |

(Continued)

FOREIGN PATENT DOCUMENTS

| CN | 101290635 A | 10/2008 |
| CN | 102591947 A | 7/2012 |

(Continued)

OTHER PUBLICATIONS

Office Action of State Intellectual Property Office (SIPO) of China dated Mar. 20, 2020.

(Continued)

*Primary Examiner* — Sean D Rossiter
*Assistant Examiner* — Stephanie Wu
(74) *Attorney, Agent, or Firm* — IP & T Group LLP

(57) ABSTRACT

A data storage device includes a nonvolatile memory apparatus suitable for accessing a target region corresponding to an access command, and a processor suitable for calculating a first hash value corresponding to the target region based on a first hash function, and updating an access count that is indexed by the first hash value.

13 Claims, 10 Drawing Sheets

(56) References Cited

U.S. PATENT DOCUMENTS

| | | | |
|---|---|---|---|
| 2014/0226389 A1 | 8/2014 | Ebsen et al. | |
| 2014/0237163 A1 | 8/2014 | Mahama | |
| 2014/0281265 A1* | 9/2014 | Atkisson | G06F 12/0806 711/136 |
| 2015/0149721 A1* | 5/2015 | Kannan | G06F 12/0891 711/122 |
| 2015/0179254 A1* | 6/2015 | Alrod | G11C 13/0069 365/148 |
| 2015/0262714 A1* | 9/2015 | Tuers | G11C 16/102 714/721 |
| 2015/0356024 A1* | 12/2015 | Loh | G06F 12/1054 711/113 |

FOREIGN PATENT DOCUMENTS

| | | |
|---|---|---|
| CN | 103150136 A | 6/2013 |
| TW | 200735124 | 9/2007 |
| TW | 201106363 | 2/2011 |
| TW | 201207859 | 2/2012 |
| TW | 201403318 | 1/2014 |
| TW | 201417100 | 5/2014 |
| TW | 201430848 | 8/2014 |

OTHER PUBLICATIONS

Office Action of State Intellectual Property Office (SIPO) of China dated Apr. 20, 2020.

\* cited by examiner

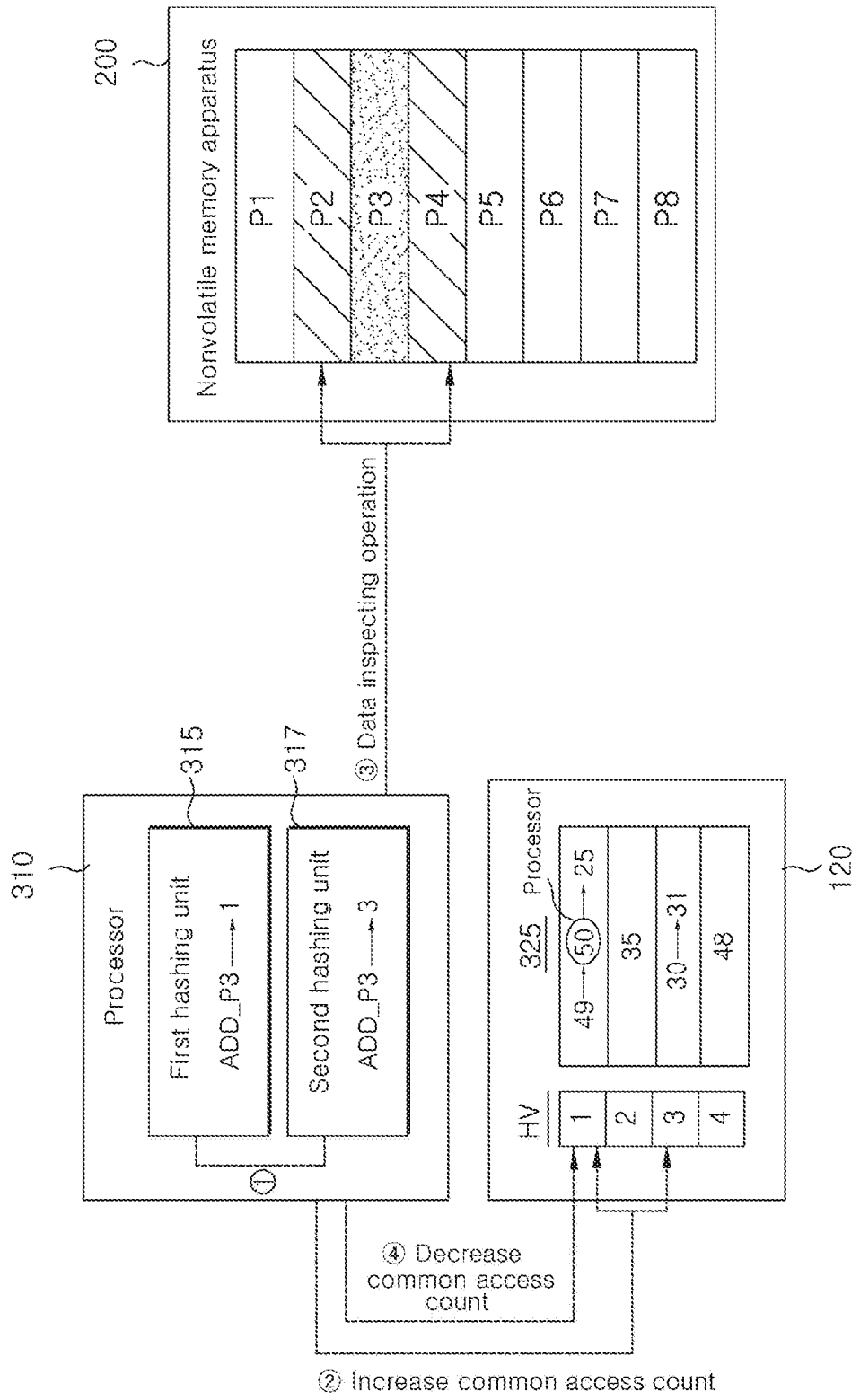

DATA STORAGE DEVICE AND OPERATING METHOD THEREOF

CROSS-REFERENCES TO RELATED APPLICATION

The present application is a continuation of U.S. application Ser. No. 14/600,909, filed on Jan. 20, 2015, which claims priority under 35 U.S.C. § 119(a) to Korean application number 10-2014-0134982, filed on Oct. 7, 2014, in the Korean Intellectual Property Office, which is incorporated herein by reference in its entirety.

BACKGROUND

1. Technical Field

Various embodiments generally relate to a data storage device and, more particularly, to a data storage device and an operating method thereof in which a reliability maintenance operation is performed to prevent the deformation or loss of data stored in a neighboring region that is adjacent to a certain region of a nonvolatile memory apparatus as the certain region of the nonvolatile memory apparatus is excessively accessed.

2. Related Art

Semiconductor apparatuses and, specifically, semiconductor memory apparatuses may be used to store data. Memory apparatuses may generally be divided into those that are nonvolatile and those that are volatile.

A nonvolatile memory apparatus may retain stored data even without a power supply. Nonvolatile memory apparatuses include flash memory, such as NAND and NOR flash, FeRAM (ferroelectric random access memory), PCRAM (phase change random access memory), MRAM (magnetic random access memory) and ReRAM (resistive random access memory).

Volatile memory apparatuses do not retain data stored therein without a constant source of power. Volatile memory apparatuses include SRAM (static random access memory) and DRAM (dynamic random access memory). Volatile memory apparatus may be used as buffer memory, cache memory, working memory, or the like, in a data processing system, where a relatively high processing speed is required.

SUMMARY

Various embodiments are directed to a data storage device with improved data reliability.

In an embodiment, a data storage device may include: a nonvolatile memory apparatus suitable for accessing a target region corresponding to an access command; and a processor suitable for calculating a first hash value corresponding to the target region based on a first hash function, and updating an access count that is indexed by the first hash value.

In an embodiment, a data storage device may include: a nonvolatile memory apparatus including a plurality of regions corresponding to a single hash value; and a processor suitable for managing a common access count of the plurality of regions, wherein the access count is indexed by the hash value.

In an embodiment, a method for operating a data storage device may include: in response to an access command, accessing a target region among a plurality of regions which correspond to a single hash value; and increasing an access count that is indexed by the hash value.

BRIEF DESCRIPTION OF THE DRAWINGS

FIG. 12 is a schematic diagram illustrating a method for a reliability maintenance operation of a processor shown in FIG. 10.

DETAILED DESCRIPTION

Hereinafter, a data storage device and an operating method thereof will be described below with reference to the accompanying drawings through various examples of embodiments.

Figure 1:
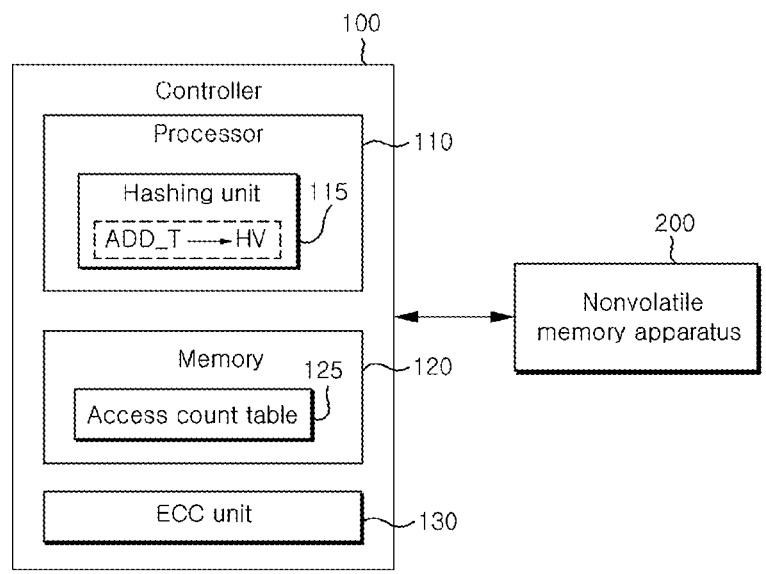
FIG. 1 is an exemplary block diagram illustrating a data storage device in accordance with an embodiment.

FIG. 1 is an exemplary block diagram illustrating a data storage device 10 in accordance with an embodiment.

The data storage device 10 may store the data provided from an external device (not shown), in response to a write request from the external device. Also, the data storage device 10 may provide stored data to the external device, in response to a read request from the external device. The data storage device 10 may be configured by a Personal Computer Memory Card International Association (PCMCIA) card, a compact flash (CF) card, a smart media card, a memory stick, a multimedia card in the form of an MMC, an eMMC, an RS-MMC and an MMC-micro, a secure digital card in the form of an SD, a mini-SD and a micro-SD, a universal flash storage (UFS), or a solid state drive.

The data storage device 10 may include a controller 100 and a nonvolatile memory apparatus 200.

The controller 100 may include a processor 110, a memory 120, and an ECC (error correction code) unit 130.

The processor 110 may control the general operations of the data storage device 10. The processor 110 may generate an access command for accessing a target region of the nonvolatile memory apparatus 200, for example, a write command or a read command, and may provide the generated access command to the nonvolatile memory apparatus 200. The processor 110 may drive a software program for controlling the operation of the data storage device 10, on the memory 120.

The processor 110 may perform a reliability maintenance operation. The reliability maintenance operation may be performed to prevent the deformation or loss of data stored in a neighboring region adjacent to a certain region of the nonvolatile memory apparatus 200 as the certain region of the nonvolatile memory apparatus 200 is excessively accessed. The reliability maintenance operation may be performed through a data inspection operation based on an access count table 125. The processor 110 may perform the reliability maintenance operation, for example, each time an access is made to the nonvolatile memory apparatus 200 through a read command.

The processor 110 may manage the access count table 125 on the memory 120. The access count table 125 may include one or more values of access counts each of which represents how many times a corresponding region of the nonvolatile memory apparatus 200 is accessed. Each time an access is made to a target region of the nonvolatile memory apparatus 200, the processor 110 may calculate a hash value HV corresponding to the target region of the nonvolatile memory apparatus 200, and may update an access count that is indexed by the calculated hash value HV, in the access count table 125.

The processor 110 may include a hashing unit 115. The hashing unit 115 may calculate the hash value HV corresponding to the target region, based on an address ADD_T of the target region. The hashing unit 115 may hash the address ADD_T of the target region into the hash value HV based on a hash function. For instance, the hashing unit 115 may be realized as hardware such as a digital circuit, an analog circuit or a combination of digital and analog circuits. In other examples, the hashing unit 115 may be realized as software such as a firmware, or the hashing unit 115 may be realized as a combination of hardware and software.

In order to efficiently use the capacity of the memory 120, the processor 110 may manage the access counts of the plurality of regions of the nonvolatile memory apparatus 200 in an integrated way through a single value of a common access count. The processor 110 may update the single value of the common access count when an access is made to any one of the plurality of regions under the integrated management. That is to say, the common access count for the plurality of regions under the integrated management may be the sum of the access counts of the plurality of regions.

The processor 110 may manage the plurality of regions in the integrated way through a common hash value. The hashing unit 115 may hash the addresses of the plurality of regions under the integrated management into a common hash value based on a hash function. The common access count for the plurality of regions may be indexed by the common hash value. In summary, when an access is made to any one of the plurality of regions under the integrated management, the processor 110 may calculate the common hash value corresponding to the plurality of regions based on the address of the accessed region and may update the common access count that is indexed by the calculated common hash value.

The plurality of regions under the integrated management may correspond to different word lines. The plurality of regions under the integrated management may be a plurality of pages.

In the case where it is determined based on the access count table 125 that a certain region of the nonvolatile memory apparatus 200 is excessively accessed, the processor 110 may perform the data inspection operation on the neighboring region of the certain region. The data inspection operation may be performed by checking the deformation degree of the data stored in the neighboring region and by selectively performing a reclaim operation for recovering the data stored in the neighboring region to a state before the deformation, according to the deformation degree of the data.

The memory 120 may serve as a working memory, a buffer memory or a cache memory. The memory 120 may store a software program or various program data to be driven by the processor 110, buffer data to be transmitted between the external device and the nonvolatile memory apparatus 200, or temporarily store cache data.

The memory 120 may store the access count table 125 that is managed by the processor 110. As described above, in the case where the processor 110 manages in the integrated way the plural access counts of the plurality of regions of the nonvolatile memory apparatus 200 through the common access count, the memory 120 may be efficiently used. If the processor 110 does not manage the plural access counts of the plurality of regions in the integrated way, and manages each of the plural access counts of the plurality of regions, the plural access counts of the plurality of regions will occupy the memory 120 proportionally to the number of regions. The access count table 125 may be backed up in the nonvolatile memory apparatus 200.

The ECC unit 130 may ECC-encode data to be written in the nonvolatile memory apparatus 200 for error detection, as well as error correction for the data read from the nonvolatile memory apparatus 200. For example, the ECC unit 130 may generate parity data for data to be written in the nonvolatile memory apparatus 200, and may encode the data to be written by adding the generated parity data to the data to be written.

The ECC unit 130 may ECC-decode the read data from the nonvolatile memory apparatus 200, that is, may perform the error detection and the error correction for the read data. For example, the ECC unit 130 may perform the ECC-decoding operation by detecting an error that has occurred in the read data and correcting the detected error through the parity data included in the read data.

When the data inspection operation is performed for the neighboring region of the certain region which is excessively accessed, the ECC unit 130 may check the deformation degree of the data read from the neighboring region. For example, the ECC unit 130 may check an error occurrence rate by detecting errors that have occurred in the data read from the neighboring region. The ECC unit 130 may report the error occurrence rate of the data read from the neighboring region to the processor 110 such that the processor 110 may determine whether it is necessary to perform the reclaim operation for recovering the data stored in the neighboring region to a state before deformation.

The nonvolatile memory apparatus 200 may store data under the control of the controller 100. The nonvolatile memory apparatus 200 may access a target region corresponding to an access command.

Figure 2:
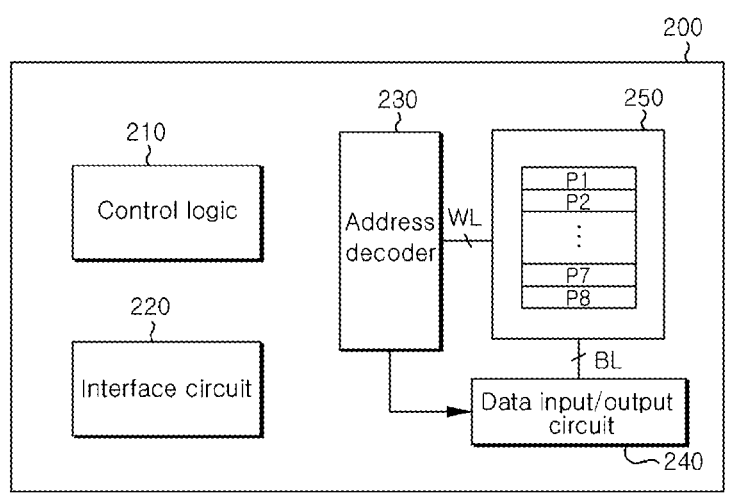
FIG. 2 is an exemplary block diagram illustrating a nonvolatile memory apparatus shown in FIG. 1.

FIG. 2 is an exemplary block diagram illustrating the nonvolatile memory apparatus 200 shown in FIG. 1.

The nonvolatile memory apparatus 200 may include a control logic 210, an interface circuit 220, an address decoder 230, a data input/output circuit 240, and a memory cell array 250.

The control logic 210 may control the general operations of the nonvolatile memory apparatus 200. The control logic 210 may control a write, read or erase operation for the memory cell array 250, in response to an access command provided from the controller 100, for example, a write, read or erase command.

The interface circuit 220 may exchange various control signals including access commands and data, with the controller 100. The interface circuit 220 may transmit various control signals and data which are inputted thereto, to the internal units of the nonvolatile memory apparatus 200.

The address decoder 230 may decode the row address and the column address included in an access command. The address decoder 230 may control word lines WL to be selectively driven according to a decoding result of the row address. The address decoder 230 may control the data input/output circuit 240 to selectively drive bit lines BL according to a decoding result of the column address.

The data input/output circuit 240 may transmit the data transmitted from the interface circuit 220 to the memory cell array 250 through the bit lines BL. The data input/output circuit 240 may transmit the data read from the memory cell array 250 through the bit lines BL, to the interface circuit 220.

The memory cell array 250 may include a plurality of memory cells (not shown) which are respectively disposed at regions where the word lines WL and the bit line BL cross each other. The memory cells may be classified according to the number of bits which are stored in each cell. For example, the memory cells may be classified into single level cells, each of which stores 1 bit, and multi-level cells, each of which stores at least 2 bits.

The memory cell array 250 may include a plurality of storage regions which are divided according to an operation unit. For example, the memory cell array 250 may include first to eighth pages P1 to P8. While it is illustrated that the memory cell array 250 of FIG. 2 includes 8 pages, it is to be noted that the number of the pages included in the memory cell array 250 is not specifically limited.

A page may be a unit by which a write operation or a read operation is performed for the memory cell array 250. In other words, the memory cell array 250 may be accessed in units of pages. A page may be allocated with a corresponding address, and may be accessed according to an address. A page may be accessed by driving a corresponding word line.

Figure 3A:
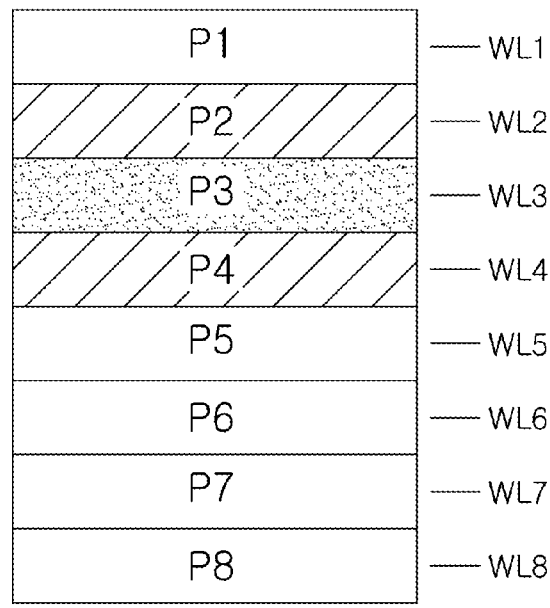
FIG. 3a is a schematic diagram illustrating the relationship between pages and word lines shown in FIG. 2.

FIG. 3a is a schematic diagram illustrating corresponding relationships between the pages P1 to P8 and the word lines WL1 to WL8 shown in FIG. 2.

Referring to FIG. 3a, a single word line may correspond to a single page. The respective first to eighth pages P1 to P8 included in the memory cell array 250 may respectively correspond to first to eighth word lines WL1 to WL8. When 1 word line corresponds to 1 page, the memory cells electrically coupled to a word line may be single level cells.

As described above, in the reliability maintenance operation, the access count corresponding to the target region may be updated, and the data inspection operation may be performed for the neighboring region. The target region and the neighboring region may correspond to word lines adjacent to each other. When 1 word line corresponds to 1 page, in the case where the target region is, for example, the third page P3, the neighboring regions may be the second and fourth pages P2 and P4.

Figure 3B:
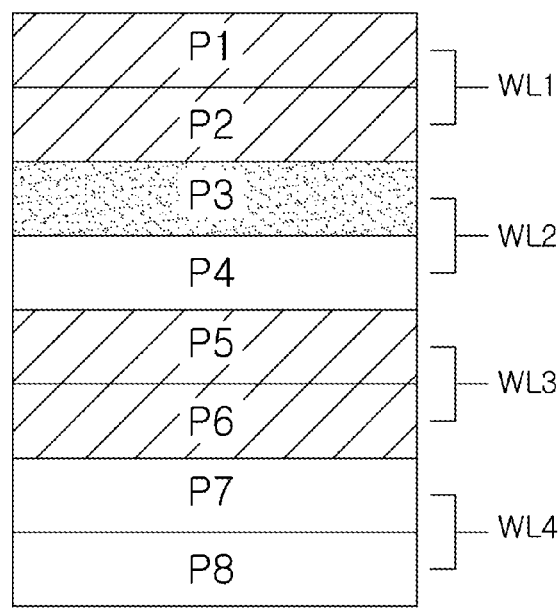
FIG. 3b is another schematic diagram illustrating the relationship between pages and word lines shown in FIG. 2.

FIG. 3b is a schematic diagram illustrating other corresponding relationships between the pages P1 to P8 and the word lines WL1 to WL8 shown in FIG. 2.

Referring to FIG. 3b, a single word line may correspond to two pages. The first and second pages P1 and P2 included in the memory cell array 250 may correspond to a first word line WL1, the third and fourth pages P3 and P4 may correspond to a second word line WL2, the fifth and sixth pages P5 and P6 may correspond to a third word line WL3, and the seventh and eighth pages P7 and P8 may correspond to a fourth word line WL4. When 1 word line corresponds to 2 pages, the memory cells electrically coupled to a word line may be multi-level cells.

As described above, in the reliability maintenance operation, the access count corresponding to the target region may be updated, and the data inspection operation may be performed for the neighboring region. The target region and the neighboring region may correspond to adjacent word lines. When a single word line corresponds to 2 pages, in the case where the target region is, for example, the third page P3, the neighboring regions may be the first, second, fifth and sixth pages P1, P2, P5 and P6.

Figure 4:
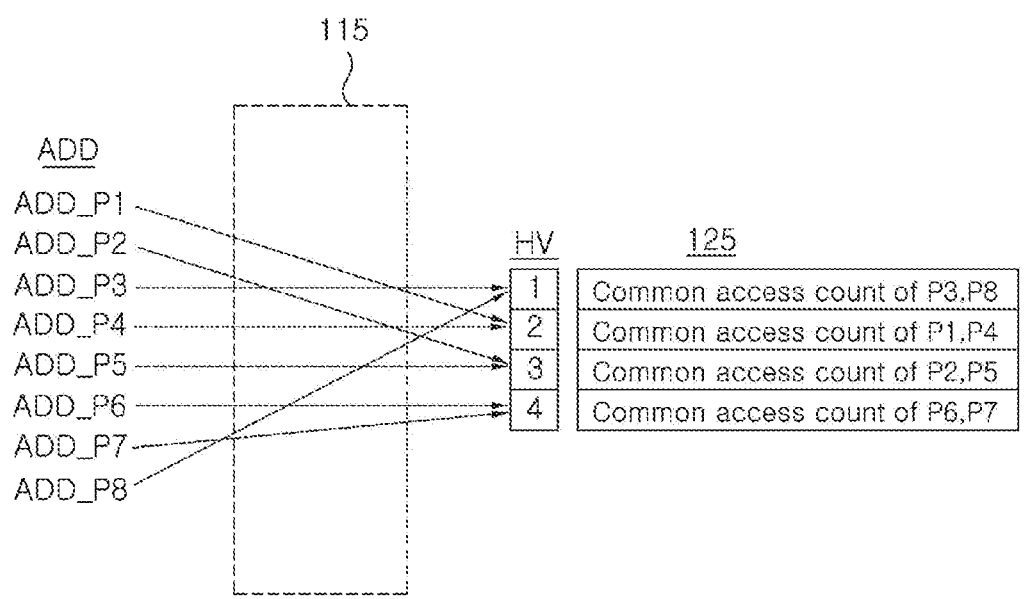
FIG. 4 is a schematic diagram illustrating an operating method of a hashing unit shown in FIG. 1.

FIG. 4 is a schematic diagram illustrating an operating method of the hashing unit 115 shown in FIG. 1 to calculate the hash values HV corresponding to the target regions accessed by access commands. Referring to FIG. 4, the access count table 125 indexed by the hash values HV is also shown.

The hashing unit 115 may calculate the hash values HV that correspond to the first to eighth pages P1 to P8 of FIG. 2. The hashing unit 115 may hash the addresses ADD of the respective first to eighth pages P1 to P8 into a corresponding one of the hash values HV based on a hash function. For example, in the case where the target region accessed by the access command is the first page P1, the hashing unit 115 may hash the address ADD_P1 of the first page P1 into the common hash value '2'.

As described above, the processor 110 may manage the access counts of a plurality of pages in the integrated way, and to this end, the hashing unit 115 may hash the addresses of the plurality of pages into the common hash value. The plurality of pages to be hashed into the common hash value may be determined by a hash function.

In the case where an access is made to any one of a plurality of pages, the access counts of which are managed in the integrated way, the hashing unit 115 may calculate a corresponding one of the common hash values. The calculated common hash value may be the index value of the common access count that is managed in the integrated way for the plurality of pages.

Referring to FIG. 4, the hashing unit 115 may hash, for example, the addresses ADD_P3 and ADD_P8 of the third and eighth pages P3 and P8 into the common hash value '1'. In the case where any one of the third and eighth pages P3 and P8 is accessed, the hashing unit 115 may calculate the common hash value '1'. Such hashing will cause the processor 110 to manage in the integrated way the access counts of the third and eighth pages P3 and P8 by indexing them to the common hash value '1'.

While it is illustrated in FIG. 4 that the hash unit 115 hashes the addresses of 2 pages into a common hash value, it is to be noted that the number of pages which are to be hashed into a common hash value is not specifically limited. In the embodiments, the number of pages, the access counts of which are managed in the integrated way, is not specifically limited.

Figure 5:
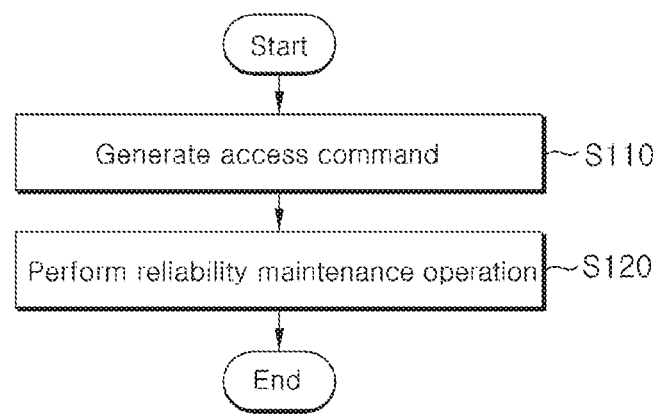
FIG. 5 is a flow chart illustrating an operating method of a data storage device shown in FIG. 1.

FIG. 5 is a flow chart illustrating an operating method of the data storage device 10 shown in FIG. 1.

In step S110, the processor 110 may generate the access command for accessing the target region. For example, the processor 110 may generate a read command for reading data from the target region. The nonvolatile memory apparatus 200 will access the target region in response to the access command provided from the processor 110.

In step S120, the processor 110 may perform reliability maintenance operations. The reliability maintenance operation may be performed by the data inspection operation based on the access count table 125.

The processor 110 may perform the reliability maintenance operation each time an access is made to the nonvolatile memory apparatus 200. The processor 110 may perform the reliability maintenance operation each time an access is made to the nonvolatile memory apparatus 200, for example, through the read command.

Figure 6:
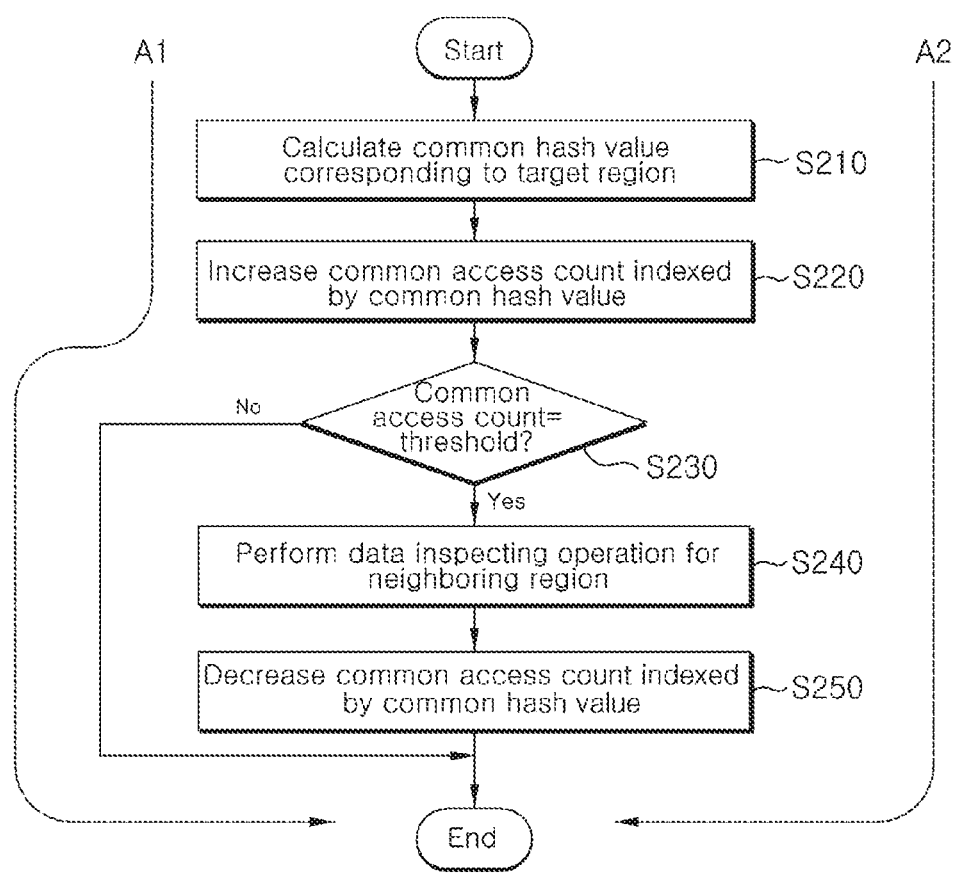
FIG. 6 is a flow chart illustrating a method for a reliability maintenance operation of a processor shown in FIG. 1.

FIG. 6 is a flow chart illustrating a method for a reliability maintenance operation of the processor 110 shown in FIG. 1. The method for a reliability maintenance operation of the processor 110 shown in FIG. 6 may correspond to the step S120 of FIG. 5. It is assumed that the processor 110 has generated the access command for accessing the target region.

In step S210, the hashing unit 115 may calculate the common hash value corresponding to the target region. The hashing unit 115 may hash the address of the target region into a corresponding one of the hash values based on a hash function.

In step S220, the processor 110 may increase the common access count that is indexed by the calculated common hash value.

In step S230, the processor 110 may determine whether the updated common access count reaches a threshold. In the case where it is determined that the updated common access count reaches the threshold (Yes), the process may proceed to step S240. In the case where it is determined that the updated common access count does not reach the threshold (No), the process may be ended. Namely, in the case where the updated common access count does not reach the threshold, since it implies that the target region has not been excessively accessed, the processor 110 may end the reliability maintenance operation.

In step S240, the processor 110 may perform the data inspection operation for the neighboring region adjacent to the target region. The data inspection operation may be performed by checking the deformation degree of the data stored in the neighboring region and by selectively performing the reclaim operation for recovering the data stored in the neighboring region to a state before deformation according to the deformation degree of the data.

In step S250, the processor 110 may decrease the common access count that is indexed by the common hash value calculated in the step S210. Since the data stored in the neighboring region are inspected through the data inspection operation in the step S240, the processor 110 may decrease the common access count that corresponds to the target region in order to delay a subsequent data inspection operation for the neighboring region.

As described above, the processor 110 may manage the common access counts of a plurality of regions under the integrated management including the target region. In this case, the common access count that is increased in the step S220 may also be increased by accesses to regions other than the target region among the plurality of regions under the integrated management. Even though the common access count reaches the threshold by the access to the target region, such a result may be caused even by excessive accesses to the other regions than the target region under the integrated management. Therefore, as the processor 110 does not completely reset the common access count corresponding to the target region but decreases the common access count to a predetermined value, the probability of excessive accesses to the regions other than the target region among the plurality of regions under the integrated management, may be maintained to some extent.

Figure 7:
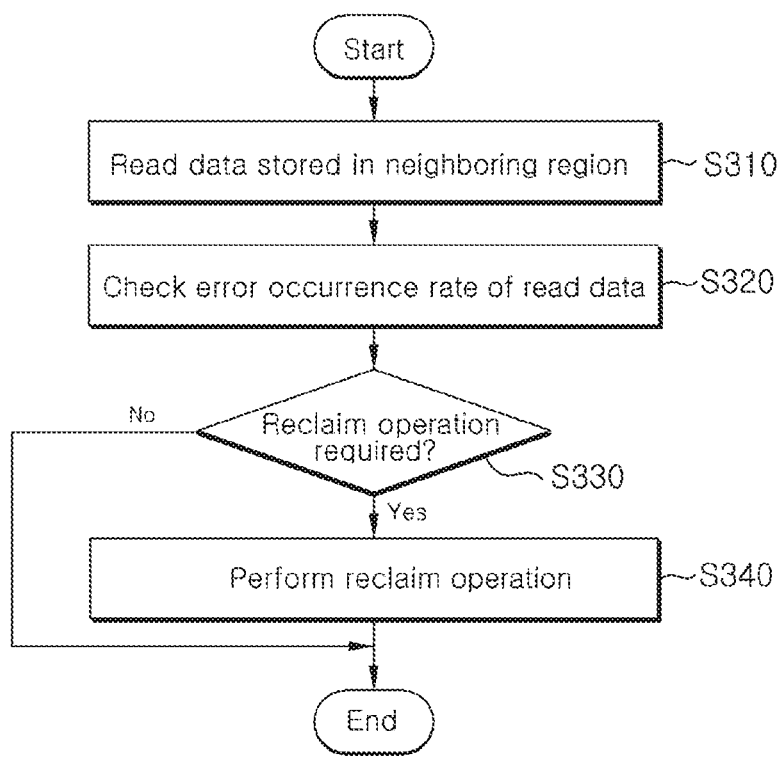
FIG. 7 is a flow chart illustrating a method for a data inspection operation of a processor shown in FIG. 1.

FIG. 7 is a flow chart illustrating a method for a data inspection operation of the processor 110 shown in FIG. 1. The method for the data inspection operation of the processor 110 shown in FIG. 7 may correspond to the step S240 of FIG. 6.

In step S310, the processor 110 may read the data stored in the neighboring region adjacent to the target region.

In step S320, the ECC unit 130 may check the error occurrence rate of the data read from the neighboring region. The ECC unit 130 may report the error occurrence rate to the processor 110 such that the processor 110 may determine whether it is necessary to perform the reclaim operation for the neighboring region.

In step S330, the processor 110 may determine whether it is necessary to perform the reclaim operation for the neighboring region based on the error occurrence rate read from the neighboring region. For example, the processor 110 may compare the error occurrence rate and a threshold, and determine that it is necessary to perform the reclaim operation in when the error occurrence rate exceeds the threshold. In the case where it is determined that it is necessary to perform the reclaim operation (Yes), the process may proceed to step S340. In the case where it is determined that it is not necessary to perform the reclaim operation (No), the process may be ended.

In step S340, the processor 110 may perform the reclaim operation for the neighboring region to recover the data stored in the neighboring region to the state before deformation. For example, the processor 110 may perform the reclaim operation through a garbage collecting operation. The processor 110 may recover the data stored in the neighboring region to the state before deformation by restoring the data stored in the neighboring region into another region.

Figure 8:
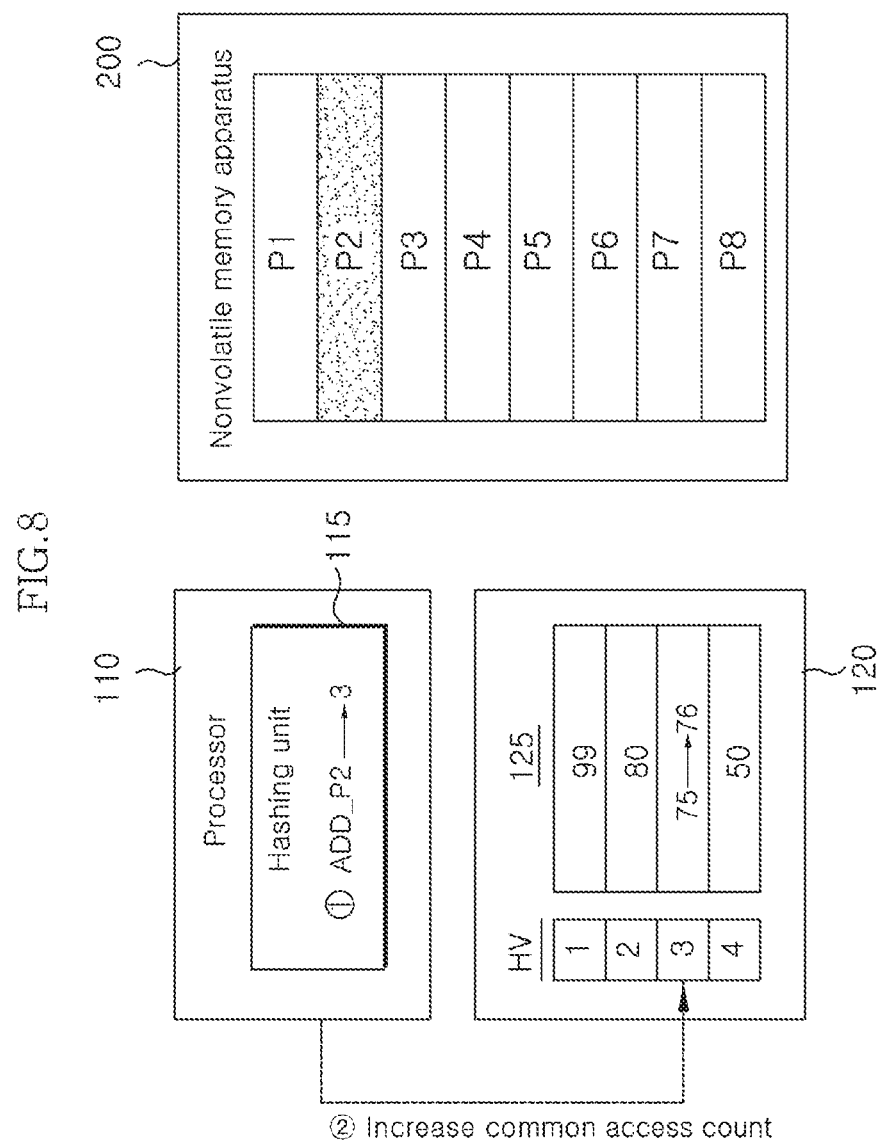
FIGS. 8 and 9 are schematic diagrams illustrating a method for a reliability maintenance operation of a processor shown in FIG. 1.
Figure 9:
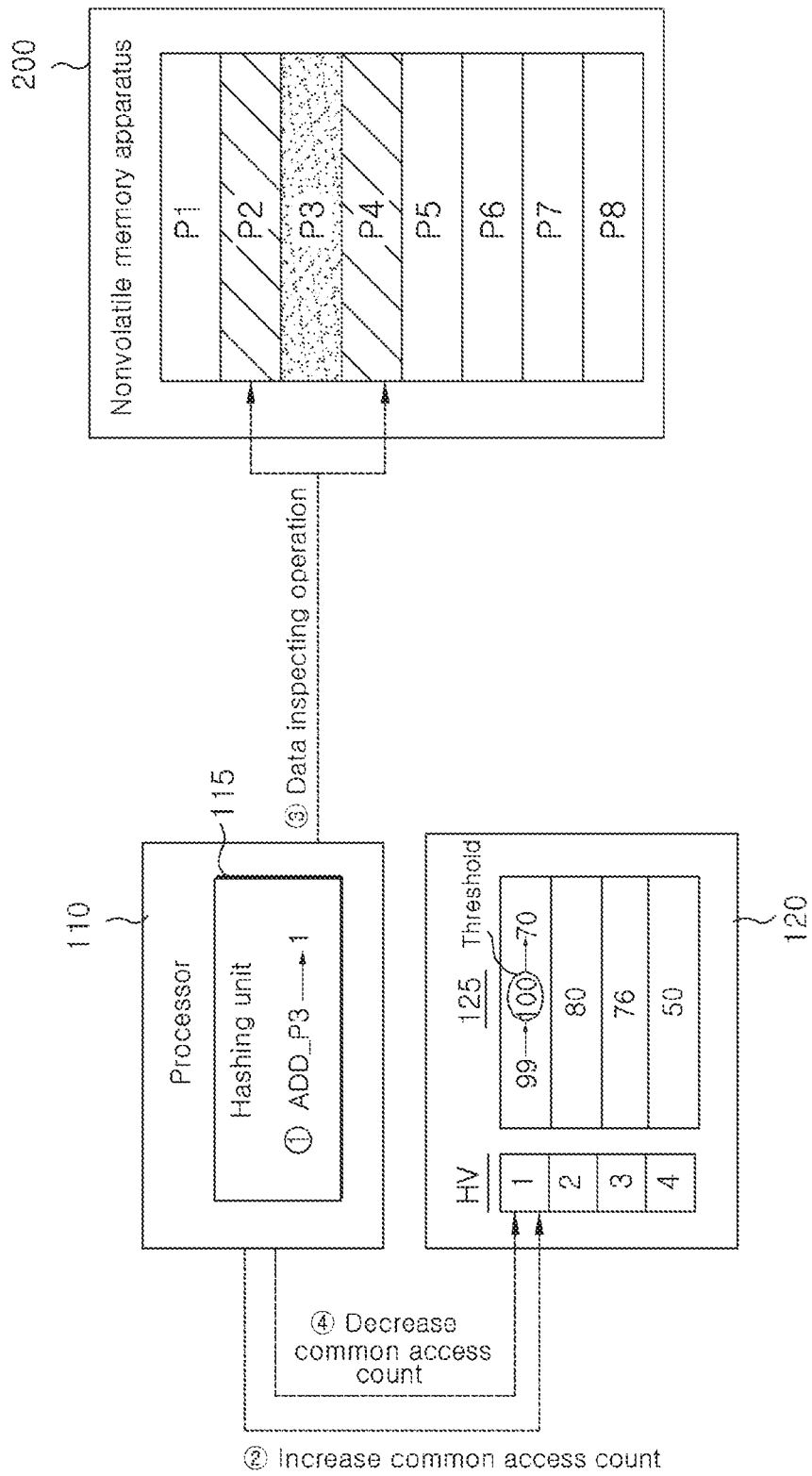

FIGS. 8 and 9 are schematic diagrams illustrating a method for a reliability maintenance operation of the processor 110 shown in FIG. 1. FIG. 8 shows the method for a reliability maintenance operation of the processor 110 when the processor 110 determines that the updated common access count does not reach the threshold (No) in the step 230, shown in FIG. 6. FIG. 9 shows the method for a reliability maintenance operation of the processor 110 when the processor 110 determines that the updated common access count reaches the threshold (Yes) in the step 230 shown in FIG. 6. It is assumed that the processor 110 performs the reliability maintenance operation to prevent the deformation or loss of data by a read disturbance effect exerted on the neighboring region by the target region each time an access is made to the nonvolatile memory apparatus 200 through a read command.

Hereinafter, the method for the processor 110 performing the reliability maintenance operation will be described in detail with reference to FIGS. 4, 6 and 8. It is assumed that the processor 110 has generated a read command for the target region, for example, the second page P2, and has read the second page P2.

The hashing unit 115 may calculate the common hash value HV corresponding to the second page P2 (①). The hashing unit 115 may hash the address ADD_P2 of the second page P2 into the common hash value '3' based on the hash function according to the calculation method shown in FIG. 4.

The processor 110 may increase the common access count that is indexed by the common hash value '3' in the access count table 125 on the memory 120 (②).

The processor 110 may determine whether the updated common access count reaches the threshold. In the case where the threshold is set to 100, the processor 110 may determine that the updated common access count does not reach the threshold since it is still 76. The processor 110 may end the reliability maintenance operation.

Next, another method for the processor 110 to perform the reliability maintenance operation will be described in detail with reference to FIGS. 4, 6 and 9. It is assumed that the processor 110 has generated a read command for the target region, for example, the third page P3, and has read the third page P3.

The hashing unit 115 may calculate the common hash value HV corresponding to the third page P3 (①). The hashing unit 115 may hash the address ADD_P3 of the third page P3 into the common hash value '1' based on the hash function according to the calculation method shown in FIG. 4.

The processor 110 may increase the common access count that is indexed by the common hash value '1' in the access count table 125 on the memory 120 (②).

The processor 110 may determine whether the updated common access count reaches the threshold. In the case where the threshold is set to 100, the processor 110 may determine that the updated common access count has reached the threshold since it is 100.

The processor 110 may perform the data inspection operation for the neighboring regions (③). When a single word line corresponds to a single page, as shown in FIG. 3a, the processor 110 may perform the data inspection operation for the second and fourth pages P2 and P4. Although not illustrated, when a single word line corresponds to 2 pages, the processor 110 may perform the data inspection operation for the first, second, fifth and sixth pages P1, P2, P5 and P6, which are the neighboring regions of the target region or the third page P3.

After performing the data inspection operation for the neighboring regions, the processor 110 may decrease the common access count that is indexed by the common hash value '1' in the access count table 125 (④). Since the data stored in the second and fourth pages P2 and P4 are inspected through the data inspection operation, the processor 110 may decrease the common access count to delay a subsequent data inspection operation for the second and fourth pages P2 and P4. However, since the common access count indexed by the common hash value '1' corresponds to both of the third and eighth pages P3 and P8 under the integrated management, as shown in FIG. 4, the processor 110 may decrease the common access count indexed by the common hash value '1' to a predetermined value, for example, 70. That is to say, the processor 110 may not completely reset the common access count indexed by the common hash value '1' in order to maintain some probability of excessive accesses to the eighth page P8 other than the third page P3 under the integrated management.

Figure 10:
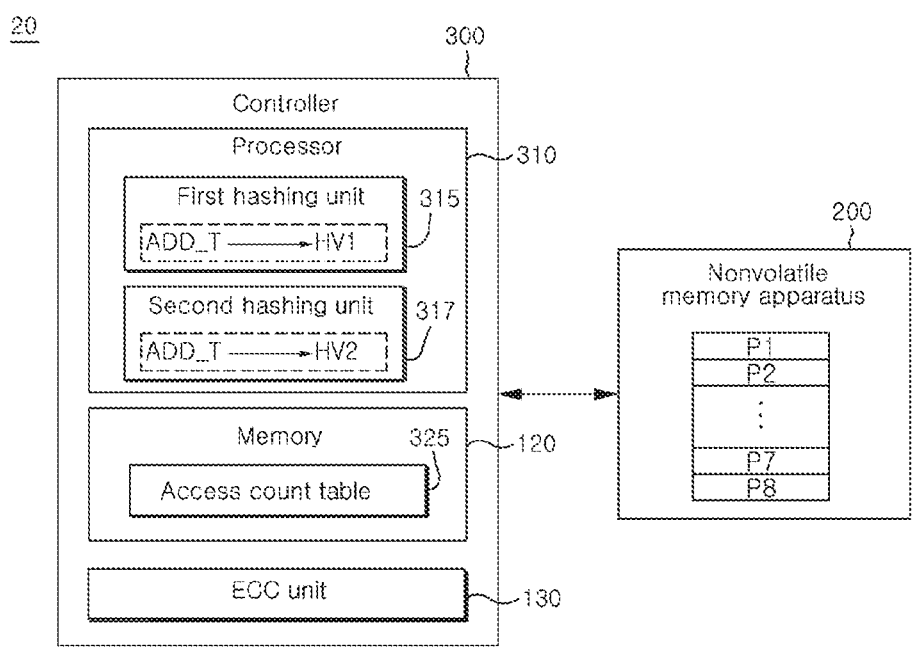
FIG. 10 is a block diagram illustrating a data storage device in accordance with an embodiment.

FIG. 10 is a block diagram illustrating a data storage device 20 in accordance with an embodiment. In FIG. 10, the same reference numerals as in FIG. 1 will be used for substantially the same elements as the data storage device 10 described above with reference to FIG. 1, and detailed descriptions for the corresponding elements will be omitted.

The data storage device 20 may be the same as the data storage device 10 described with reference to FIG. 1 except that the controller 300 includes a first hashing unit 315 and a second hashing unit 317.

A processor 310 may manage an access count table 325. The processor 310 may calculate a plurality of common hash values corresponding to the target region of the nonvolatile memory apparatus 200, for example, a first common hash value HV1 and a second common hash value HV2, each time an access is made to the nonvolatile memory apparatus 200 through an access command, and may update both of the common access counts in the access count table 325 that are indexed by the first and second common hash values HV1 and HV2, respectively.

The processor 310 may include the first hashing unit 315 and the second hashing unit 317. Each of the first hashing unit 315 and the second hashing unit 317 may be the same as the hashing unit 115 described with reference to FIGS. 1 to 9. The first hashing unit 315 and the second hashing unit 317 may respectively calculate different common hash values corresponding to the target region. The first hashing unit 315 may hash the address ADD_T of the target region into the first common hash value HV1 based on a first hash function. The second hashing unit 317 may hash the address ADD_T of the target region into the second common hash value HV2 based on a second hash function.

While it is shown in FIG. 10 that the processor 310 includes 2 hashing units, it is to be noted that the number of hashing units to be included in the processor 310 is not specifically limited. According to an embodiment, different hash values corresponding to a target region may be calculated by the number of the hashing units included in the processor 310, and the processor 310 may update all access counts that are indexed by the calculated hash values.

Figure 11:
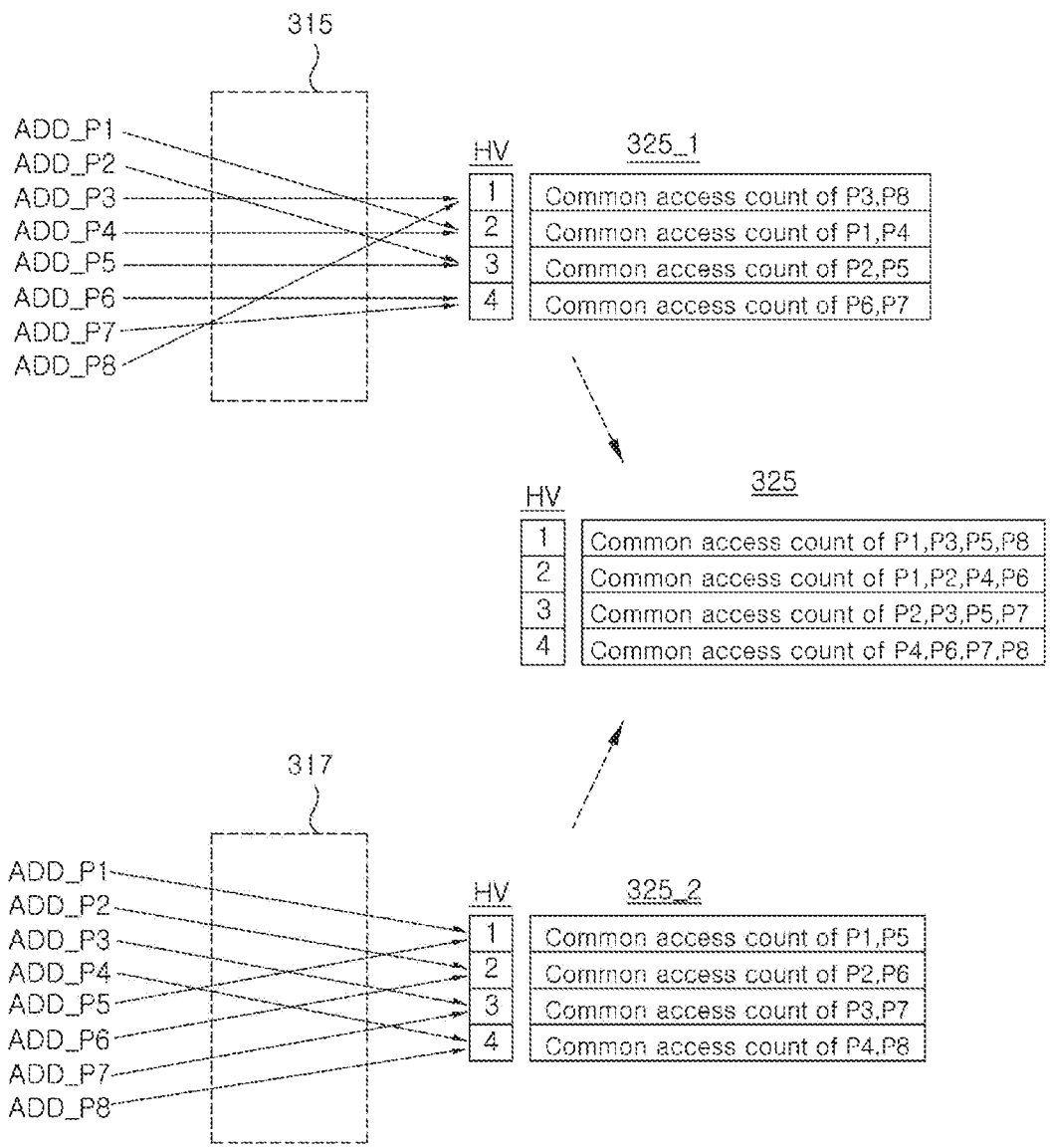
FIG. 11 is a schematic diagram illustrating an operating method of first and second hashing units shown in FIG. 10.

FIG. 11 is a schematic diagram illustrating an operating method of first and second hashing units 315 and 317 shown in FIG. 10 to calculate different hash values HV, that is, the first common hash values HV1 and the second common hash values HV2 corresponding to a single target region accessed by the access command. Referring to FIG. 11, the access count table 325 indexed by the hash values HV is also shown.

The first hashing unit 315 and the second hashing unit 317 may calculate the first common hash values HV1 and the second common hash values HV2 corresponding to respective first to eighth pages P1 to P8. The first hashing unit 315 may hash addresses ADD of the respective first to eighth pages P1 to P8 into a corresponding one of the first common hash values HV1 based on the first hash function. The second hashing unit 317 may hash the addresses ADD of the respective first to eighth pages P1 to P8 into a corresponding one of the second common hash values HV2 based on the second hash function. For example, in the case where the target region accessed by the access command is the third page P3, the first hashing unit 315 may hash the address ADD_P3 of the third page P3 into the first common hash value '1', and the second hashing unit 317 may hash the address ADD_P3 of the third page P3 into the second common hash value '3'.

Assuming that the processor 310 calculates only the first common hash values HV1 by the first hashing unit 315, the processor 310 will manage a first access count sub-table 325_1 that is indexed by the first common hash values HV1. Similarly, assuming that the processor 310 calculates only the second common hash values HV2 by the second hashing unit 317, the processor 310 will manage a second access count sub-table 325_2 that is indexed by the second common hash values HV2. As the processor 310 calculates the first common hash values HV1 and the second common hash values HV2 by the first hashing unit 315 and the second hashing unit 317, the processor 310 may manage the access count table 325 in which the first access count sub-table 325_1 and the second access count sub-table 325_2 are integrated. For example, the first common hash value '1' in the first access count sub-table 325_1 may index the common access count for both of the third and eighth pages P3 and P8, and the second common hash value '1' in the second access count sub-table 325_2 may index the common access count for both of the first and fifth pages P1 and P5. Therefore, the common hash value '1' in the access count table 325 may index four of the first, third, fifth, and eighth pages P1, P3, P5, and P8.

FIG. 12 is a schematic diagram illustrating a method for a reliability maintenance operation of the processor 310 shown in FIG. 10. It is assumed that the processor 310 performs the reliability maintenance operation to prevent the deformation or loss of data by the read disturbance effect exerted on the neighboring region by the target region each time an access is made to the nonvolatile memory apparatus 200 through a read command.

Hereinafter, the method for the processor 310 performing the reliability maintenance operation will be described in detail with reference to FIGS. 10 to 12. It is assumed that the processor 310 generates a read command for the target region, for example, a third page P3, and reads the third page P3.

The first hashing unit 315 and the second hashing unit 317 may respectively calculate the first common hash value HV1 and the second common hash value HV2 corresponding to the third page P3 (①). The first hashing unit 315 may hash the address ADD_P3 of the third page P3 into the first common hash value '1' based on the first hash function according to the calculation method shown in FIG. 11. The second hashing unit 317 may hash the address ADD_P3 of the third page P3 into the second common hash value '3' based on the second hash function according to the calculation method shown in FIG. 11.

The processor 310 may increase the common access count indexed by the calculated first common hash value '1' from 49 to 50 in the access count table 325 on the memory 120, and increase the common access count indexed by the calculated second common hash value '3' from 30 to 31 (②).

The processor 310 may determine whether one or more of the updated common access counts reach the threshold. In the case where the threshold is set to 50, the processor 310 may determine that the common access count indexed by the first common hash value '1' has reached the threshold.

The processor 310 may perform the data inspection operation for the neighboring regions (③). When a single page corresponds to a single word line, the processor 310 may perform the data inspection operation for the second and fourth pages P2 and P4. Although not illustrated, when a single word line corresponds to 2 pages, the processor 310 may perform the data inspection operation for the first, second, fifth and sixth pages P1, P2, P5 and P6, which are the neighboring regions of the target region or the third page P3.

After performing the data inspection operation for the neighboring regions, the processor 310 may decrease the common access count indexed by the first common hash value '1' in the access count table 325 (④). Since the data stored in the second and fourth pages P2 and P4 are inspected through the data inspection operation, the processor 310 may decrease the common access count to delay a subsequent data inspection operation for the second and fourth pages P2 and P4. However, because the common access count indexed by the first common hash value '1' corresponds to all of the first, third, fifth and eighth pages P1, P3, P5 and P8 under the integrated management, as shown in FIG. 11, the processor 310 may decrease the common access count indexed by the first common hash value '1' to a preset value, for example, 25. In other words, the processor 310 may not completely reset the common access count indexed by the first common hash value '1' in order to maintain some probability of excessive accesses to the first, fifth and eighth pages P1, P5 and P8, other than the third page P3, under the integrated management.

The data storage device 20 described above with reference to FIGS. 10 to 12 may be effective in the following situation. For example, it is assumed in FIG. 12 that the eighth page P8 has been excessively accessed before the third page P3 is accessed. The eighth page P8 may correspond to the first common hash value '1' by the first hashing unit 315, and correspond to the second common hash value '4' by the second hashing unit 317. Accordingly, the common access counts in the access count table 325 indexed by the first common hash value '1' and the second common hash value '4' may be increased close to the threshold, for example, to 49 and 48, respectively. In this state, as a result of the access to the third page P3, the common access count in the access count table 325 indexed by the first common hash value '1' may reach the threshold of 50 and then may be decreased to 25. Nevertheless, since the common access count in the access count table 325 indexed by the second common hash value '4' is maintained as it is, an opportunity to perform the data inspection operation for the neighboring regions of the eighth page P8 may be afforded at an earlier time, and thus, data reliability may be improved.

As is apparent from the above descriptions, the data storage device according to the embodiments may provide improved data reliability.

While various embodiments have been described above, it will be understood to those skilled in the art that the embodiments described are examples only. Accordingly, the data storage device and the operating method thereof described herein should not be limited based on the described embodiments.

What is claimed is:

1. A data storage device comprising:
   a nonvolatile memory apparatus configured to access a target region corresponding to a read command; and
   a processor configured to increase a first access count and a second access count after the accessing of the target region, the first access count corresponding to a plurality of first regions including the target region, the second access count corresponding to a plurality of second regions including the target region, and perform a data inspection operation on a region related to the target region when any one of the access counts reaches a threshold,
   wherein the processor decreases an access count which reaches the threshold to a predetermined value other than zero after performing the data inspection operation.

2. The data storage device of claim 1, wherein the processor calculates one or more hash values corresponding to the target region based on an address of the target region, and increases the access counts that are indexed by the hash values.

3. The data storage device of claim 1, wherein the first regions and the second regions correspond to different word lines.

4. The data storage device of claim 1, wherein the processor compares the access counts with the threshold, and performs the data inspection operation for one or more neighboring regions that are adjacent to the target region according to the comparison.

5. A data storage device comprising:
a nonvolatile memory apparatus including a plurality of first regions corresponding to a first hash value and a plurality of second regions corresponding to a second hash value; and
a processor configured to manage a first common access count corresponding to the plurality of first regions and a second common access count corresponding to the plurality of second regions,
wherein the first common access count is indexed by the first hash value and the second common access count is indexed by the second hash value,
wherein the first regions and the second regions include a target region commonly, and
wherein the processor performs a data inspection operation for one or more neighboring regions adjacent to the target region when any one of the first common access count and the second common access count reaches a threshold, and decreases the any one of the first common access count and the second common access count which reaches the threshold to a predetermined value other than zero after performing the data inspection operation.

6. The data storage device of claim 5, wherein the plurality of first regions and the plurality of second regions correspond to different word lines.

7. The data storage device of claim 5, wherein the process comprises a first hashing unit configured to calculate the first hash value based on an address of one of the plurality of first regions and a second hashing unit configured to calculate the second hash value based on an address of one of the plurality of second regions.

8. The data storage device of claim 5, wherein the processor increases the first common access count and the second common access count when accessing the target region.

9. A method for operating a data storage device, comprising:
in response to a read command, accessing a target region included in a nonvolatile memory apparatus;
increasing a first access count and a second access count after the accessing of the target region, the first access count corresponding to a plurality of first regions including the target region, the second access count corresponding to a plurality of second regions including the target region;
performing a data inspection operation on a region related to the target region when any one of the access counts reaches a threshold; and
decreasing an access count which reaches the threshold to a predetermined value other than zero after performing the data inspection operation,
wherein the first regions include one or more regions which are not included in the second regions, and the second regions include one or more regions which are not included in the first regions.

10. The method of claim 9, wherein the first regions and the second regions correspond to different word lines.

11. The method of claim 9, wherein the increasing of the access counts further comprises:
calculating one or more hash values corresponding to the target region based on an address of the target region; and
increasing the access counts that are indexed by the hash values.

12. The method of claim 9, wherein the performing of the data inspection operation comprises:
comparing the access counts with the threshold; and
performing the data inspection operation for one or more neighboring regions that are adjacent to the target region according to the comparison.

13. The method of claim 12, wherein the performing of the data inspection operation for the neighboring region comprises:
reading data stored in the neighboring regions;
checking an error occurrence rate of the data read from the neighboring regions; and
performing selectively a reclaim operation for recovering the data stored in the neighboring regions according to the error occurrence rate.

* * * * *